US007305095B2

(12) United States Patent
Rui

(10) Patent No.: US 7,305,095 B2
(45) Date of Patent: *Dec. 4, 2007

(54) SYSTEM AND PROCESS FOR LOCATING A SPEAKER USING 360 DEGREE SOUND SOURCE LOCALIZATION

(75) Inventor: Yong Rui, Sammamish, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/182,142

(22) Filed: Jul. 15, 2005

(65) Prior Publication Data

US 2005/0265562 A1 Dec. 1, 2005

Related U.S. Application Data

(63) Continuation of application No. 10/228,210, filed on Aug. 26, 2002, now Pat. No. 7,039,199.

(51) Int. Cl.
*H03R 3/00* (2006.01)
*G10L 11/06* (2006.01)

(52) U.S. Cl. ......................... 381/92; 381/122; 704/233

(58) Field of Classification Search .................. 381/91, 381/122, 92; 704/214, 233, 248, 253; 348/14.08
See application file for complete search history.

(56) References Cited

U.S. PATENT DOCUMENTS

| | | | | |
|---|---|---|---|---|
| 5,737,431 | A * | 4/1998 | Brandstein et al. | 381/92 |
| 6,317,501 | B1 * | 11/2001 | Matsuo | 381/92 |
| 6,469,732 | B1 * | 10/2002 | Chang et al. | 348/14.08 |
| 6,826,284 | B1 * | 11/2004 | Benesty et al. | 381/92 |
| 7,039,199 | B2 * | 5/2006 | Rui | 381/92 |
| 7,039,200 | B2 * | 5/2006 | Rui et al. | 381/92 |
| 7,123,727 | B2 * | 10/2006 | Elko et al. | 381/92 |

* cited by examiner

*Primary Examiner*—Xu Mei
(74) *Attorney, Agent, or Firm*—Lyon & Harr, LLP; Richard T. Lyon

(57) ABSTRACT

A system and process is described for estimating the location of a speaker using signals output by a microphone array characterized by multiple pairs of audio sensors. The location of a speaker is estimated by first determining whether the signal data contains human speech components and filtering out noise attributable to stationary sources. The location of the person speaking is then estimated using a time-delay-of-arrival based SSL technique on those parts of the data determined to contain human speech components. A consensus location for the speaker is computed from the individual location estimates associated with each pair of microphone array audio sensors taking into consideration the uncertainty of each estimate. A final consensus location is also computed from the individual consensus locations computed over a prescribed number of sampling periods using a temporal filtering technique.

5 Claims, 10 Drawing Sheets

SYSTEM AND PROCESS FOR LOCATING A SPEAKER USING 360 DEGREE SOUND SOURCE LOCALIZATION

CROSS-REFERENCE TO RELATED APPLICATIONS

This application is a continuation of a prior application entitled "A SYSTEM AND PROCESS FOR LOCATING A SPEAKER USING 360 DEGREE SOUND SOURCE LOCALIZATION" which was assigned Ser. No. 10/228,210 and filed Aug. 26, 2002 now U.S. Pat. No. 7,039,199.

BACKGROUND

1. Technical Field

The invention is related to microphone array-based sound source localization (SSL), and more particularly to a system and process for estimating the location of a speaker anywhere in a full 360 degree sweep from signals output by a single microphone array characterized by two or more pairs of audio sensor using an improved time-delay-of-arrival based SSL technique.

2. Background Art

Microphone arrays have become a rapidly emerging technology since the middle 1980's and become a very active research topic in the early 1990's [Bra96]. These arrays have many applications including, for example, video conferencing. In a video conferencing setting, the microphone array is often used for intelligent camera management where sound source localization (SSL) techniques are used to determine where to point a camera or decide which camera in an array of cameras to activate, in order to focus on the current speaker. Intelligent camera management via SSL can also be applied to larger venues, such as in a lecture hall where a camera can point to the audience member who is asking a question. Microphone arrays and SSL can also be used in video surveillance to identify where in a monitored space a person is located. Further, speech recognition systems can employ SSL to pinpoint the location of the speaker so as to restrict the recognition process to sound coming from that direction. Microphone arrays and SSL can also be utilized for speaker identification. In this context, the location of a speaker as discerned via SSL techniques is correlated to an identity of the speaker.

For most of the video conferencing related projects/papers, usually there is a video capture device controlled by the output of SSL. The video capture device can either be a controllable pan/tilt/zoom camera [Kle00, Zot99, Hua00] or an omni-directional camera. In either case, the output of the SSL can guide the conferencing system to focus on the person of interest (e.g., the person who is talking).

In general there are three techniques for SSL, i.e., steered-beamformer-based, high-resolution spectral-estimation-based, and time-delay-of-arrival (TDOA) based techniques [Bra96]. The steered-beamformer-based technique steers the array to various locations and searches for a peak in output power. This technique can be tracked back to early 1970s. The two major shortcomings of this technique are that it can easily become stuck in a local maxima and it exhibits a high computational cost. The high-resolution spectral-estimation-based technique representing the second category uses a spatial-spectral correlation matrix derived from the signals received at the microphone array sensors. Specifically, it is designed for far-field plane waves projecting onto a linear array. In addition, it is more suited for narrowband signals, because while it can be extended to wide band signals such as human speech, the amount of computation required increases significantly. The third category involving the aforementioned TDOA-based SSL technique is somewhat different from the first two since the measure in question is not the acoustic data received by the microphone array sensors, but rather the time delays between each sensor. This last technique is currently considered the best approach to SSL.

TDOA-based approaches involve two general phases—namely time delay estimation (TDE) and location phases. Within the TDE phase, of the various current TDOA approaches, the generalized cross-correlation (GCC) approach receives the most research attention and is the most successful [Wan97]. Let s(n) be the source signal, and $x_1(n)$ and $x_2(n)$ be the signals received by two microphones of the microphone array. Then:

$$x_1(n)=as(n-D)+h_1(n)*s(n)+n_1(n)$$

$$x_2(n)=bs(n)+h_2(n)*s(n)+n_2(n) \quad (1)$$

where D is the TDOA, a and b are signal attenuations, $n_1(n)$ and $n_2(n)$ are the additive noise, and $h_1(n)$ and $h_2(n)$ represent the reverberations. Assuming the signal and noise are uncorrelated, D can be estimated by finding the maximum GCC between $x_1(n)$ and $x_2(n)$ as follows:

$$D = arg \max_{\tau} \hat{R}_{x_1x_2}(\tau) \quad (2)$$

$$\hat{R}_{x_1x_2}(\tau) = \frac{1}{2\pi}\int_{-\pi}^{\pi} W(\omega)G_{x_1x_2}(\omega)e^{j\omega\tau}\,d\omega$$

where $\hat{R}_{x_1x_2}(\tau)$ is the cross-correlation of $x_1(n)$ and $x_2(n)$, $G_{x_1x_2}(\omega)$ is the Fourier transform of $\hat{R}_{x_1x_2}(\tau)$, i.e., the cross power spectrum, and $W(\omega)$ is the weighting function.

In practice, choosing the right weighting function is of great significance for achieving accurate and robust time delay estimation. As can be seen from Eq. (1), there are two types of noise in the system, i.e., the background noise $n_1(n)$ and $n_2(n)$ and reverberations $h_1(n)$ and $h_2(n)$. Previous research suggests that a maximum likelihood (ML) weighting function is robust to background noise and a phase transformation (PHAT) weighting function is better in dealing with reverberations [Bra99], i.e.,:

$$W_{ML}(\omega) = \frac{1}{\|N(\omega)\|^2} \quad (3)$$

$$W_{PHAT}(\omega) = \frac{1}{\|G_{x_1x_2}(\omega)\|^2}$$

where $\|N(\omega)\|^2$ is the noise power spectrum.

In comparing the ML approach to the PHAT approach it is noted that both have pros and cons. Generally, ML is robust to noise, but degrades quickly for environments with reverberation. On the other hand, PHAT is relatively robust to the reverberation/multi-path environments, but performs poorly in a noisy environment.

It is noted that in the preceding paragraphs, as well as in the remainder of this specification, the description refers to various individual publications identified by an alphanumeric designator contained within a pair of brackets. A listing of references including the publications corresponding to each designator can be found at the end of the Detailed Description section

SUMMARY

The present invention is directed toward a system and process for estimating the location of a person speaking using signals output by a single microphone array device that expands upon the Sound Source Localizer (SSL) procedures of the past to provide more accurate and robust locating capability in a full 360 degree setting. In one embodiment of the present system, the microphone array is characterized by two or more pairs of audio sensor and a computer is employed which has been equipped with a separate stereo-pair sound card for each of the sensor pairs. The output of each sensor in a sensor pair is input to the sound card and synchronized by the sound card. This synchronization facilitates the SSL procedure that will be discussed shortly.

The audio sensors in each pair of sensors are separated by a prescribed distance. This distance need not be the same for every pair. In the present system a minimum of two pairs of synchronized audio sensors are located in the space where the speaker is present. The sensors of these two pairs are located such that a line connecting the sensors in a pair, referred to as the sensor pair baseline, intersects the baseline of the other pair. In addition, the closer the two baselines are to being perpendicular to each other, the better for providing 360 degree SSL. Further, to take full advantage of the present system's capability to accurately detect the location of a speaker anywhere in a 360 degree sweep about the intersection point, the aforementioned two sensor pairs are located so the intersection between their baselines lies near the center of the space. It is noted that more than two pairs of audio sensors can be employed in the present system if necessary to adequately cover all areas of the space.

In operation, the location of a speaker is estimated by first inputting the signal generated by each audio sensor of the microphone array, and simultaneously sampling the signals to produce a sequence of consecutive signal data blocks from each signal. Each block of signal data is captured over a prescribed period of time and is at least substantially contemporaneous with blocks of the other signals sampled at the same time. In the case of the signals from a synchronized pair of audio sensors, the signals are assured to be contemporaneous. Thus, for every sampling period a group of nearly contemporaneous blocks of signal data are captured. For each group in turn, the noise attributable to stationary sources in each of the blocks is filtered out, and it is determined whether the filtered data block contains human speech data. The location of the person speaking is then estimated using a time-delay-of-arrival (TDOA) based SSL technique on those contemporaneous blocks of signal data determined to contain human speech components for each pair of synchronized audio sensors. Thus, if a group of blocks is found not to contain human speech data, no location measurement is attempted. This reduces the computational expense of the present process considerably in comparison to prior methods. Next, a consensus location for the speaker is computed from the individual location estimates associated with each pair of synchronized audio sensors. In general this is done by combining the individual estimates with consideration to their uncertainty as will be explained later. A refined consensus location of the person speaking is also preferably computed from the individual consensus locations computed over a prescribed number of sampling periods. This is done using a temporal filtering technique. This refined consensus location is then designated as the location of the person speaking.

In regard to the part of the speaker location process that involves distinguishing the portion of each of the array sensor signals that contains human speech data from the non-speech portions, the following procedure is employed. Generally, for each signal data block, the speech classification procedure involves computing both the total energy of the block within the frequencies associated with human speech and the "delta" energy associated with that block, and then comparing these values to the noise floor as computed using conventional methods and the "delta" noise floor energy, to determine if human speech components exist within the block under consideration. More particularly, a three-way classification scheme is implemented that identifies whether a block of signal data contains human speech components, is merely noise, or is indeterminate. If the block is found to contain speech components it is filtered and used in the aforementioned SSL procedure to locate the speaker. If the block is determined to be noise, the noise floor computations are update as will be described shortly, but the block is ignored for SSL purposes. And finally, if the block is deemed to be indeterminate, it is ignored for SSL purposes and noise floor update purposes.

The speech classification procedure for each audio sensor signal operates as follows. The procedure begins by sampling the signal to produce a sequence of consecutive blocks of the signal data representing the output of the sensor over a prescribed period of time. Each of these blocks of signal data is also converted to the frequency domain. This can be accomplished using a standard Fast Fourier Transform (FFT). An initializing procedure is then performed on three consecutive blocks of signal data. This initializing procedure involves first computing the energy of each of the three blocks across all the frequencies contained in the blocks. Beginning with the third block of signal data, the "delta" energy is computed for the block. The "delta" energy of the block is the difference between the energy of a current signal block and the energy computed for the immediately preceding signal block. Additionally, the energy of the noise floor is computed using conventional methods beginning with the second block. The energy of the noise floor is not computed until the second block is processed because it is based on an analysis of the immediately preceding block. Next, the "delta" energy of the noise floor is computed for the third block. The "delta" energy of the noise floor is computed by subtracting the noise floor energy computed in connection with the processing of the third block from the noise floor energy computed for the second block. This is why it is necessary to wait until processing the third block to compute the "delta" noise floor energy. It is also the reason why the "delta" energy is not computed until the third block is processed. Namely, as will become clear in the description of the main phase of the speech classification procedure to follow, the "delta" energy is not needed until the "delta" noise floor energy is computed.

It is next determined in the main phase of the speech classification procedure starting with the last block involved in the initiation phase, if the energy of the signal block exceeds a prescribed multiple of the computed noise floor energy, as well as whether the "delta" energy of the block exceeds a prescribed multiple of the "delta" energy of the noise floor. If the block's energy and "delta" energy both exceed their respective noise floor energy and "delta" noise floor energy multiples, then the block is designated as one containing human speech components. If, however, the foregoing conditions are not simultaneously satisfied, a second comparison is performed. In this second comparison, it is determined if block's energy is less than a prescribed multiple of the noise floor energy, and if the "delta" energy of the block is less than a prescribed multiple of the "delta" noise floor energy. If the block's energy and "delta" energy are less than their respective noise floor energy and "delta" noise floor energy multiples, then the block is designated as containing noise. Whenever a block is designated as being a noise block, the block is ignored for SSL purposes but the noise floor calculations are updated. Finally, if the conditions of the first and second comparisons are not satisfied, the block is ignored for SSL purposes and no further processing is performed.

In the case where a block is designated to be a noise block, the current noise floor value and the associated "delta" energy value are updated for use in performing the speech classification for the next sequential block of signal data captured from the same microphone array audio sensor. This entails first determining if the noise level is increasing or decreasing by identifying whether the block's computed energy has increased or decrease in comparison with the energy computed for the immediately preceding block of signal data captured from the same audio sensor. If it is determined that the noise level is increasing, then the updated noise floor energy is set equal to a first prescribed factor multiplied by the current noise floor energy value, added to one minus the first prescribed factor multiplied by the current noise floor energy value. Similarly, the updated "delta" noise floor energy is set equal to the first prescribed factor multiplied by the current "delta" noise floor energy value, added to one minus the first prescribed factor multiplied by the current "delta" noise floor energy value. The aforementioned first prescribed factor is a number smaller than, but very close to 1.0. If the noise level is decreasing, the updated noise floor energy is set equal to a second prescribed factor multiplied by the current noise floor energy value, added to one minus the second prescribed factor multiplied by the current noise floor energy value. Additionally, the updated "delta" noise floor energy is set equal to the second prescribed factor multiplied by the current "delta" noise floor energy value, added to one minus the second prescribed factor multiplied by the current "delta" noise floor energy value. In the decreasing noise level case, the second prescribed factor is a number larger than, but very close to 0.

The main phase of the speech recognition procedure then continues in the same manner for each subsequent block of signal data produced using the most current noise floor energy estimate available in the computations.

In regard to the portion of the speaker location process that involves reducing noise attributable to stationary sources for each microphone array signal, the following procedure is employed. First, for each block of signal data captured from the microphone array audio sensors that has been designated as containing human speech components, a bandpass filtering operation is performed which eliminates those frequencies not within the human speech range (i.e., about 300 hz to about 3000 hz). Next, the noise floor energy computed for the block is subtracted from the total energy of the block, and the difference is divided by the block's total energy value to produce a ratio. This ratio represents the percentage of the signal block attributable to non-noise components. Next, the signal block data is multiplied by the ratio to produce the desired estimate the non-noise portion of the signal. Once the non-noise portion of each contemporaneously captured block of array signal data designated as being a speech block has been estimated, the filtering operation for those blocks is complete and the filtered signal data of each block is next processed by the aforementioned SSL module.

In regard to the portion of the speaker location process that involves using a TDOA-based SSL technique on those contemporaneous blocks of filtered signal data determined to contain human speech data, the following procedure is employed in one embodiment of the invention. First, for each pair of synchronized audio sensors, the TDOA is estimated using a generalized cross-correlation GCC technique. While a standard weighting approach can be adopted, it is preferred that the GCC employ a combined weighting factor that compensates for both background noise and reverberations. More specifically, the weighting factor is a combination of a maximum likelihood (ML) weighting function that compensates for background noise and a phase transformation (PHAT) weighting function that compensates for reverberations. The ML weighting function is combined with the PHAT weighting function by multiplying the PHAT function by a proportion factor ranging between 0 and 1.0 and multiplying the ML function by one minus the proportion factor, and then adding the results. Generally, the proportion factor is selected to reflect the proportion of background noise to reverberations in the environment that the person speaking is present. This can be accomplished using a fixed value if the conditions in the environment are known and reasonably stable as will often be the case. Alternately, in the dynamic implementation, the proportion factor would be set equal to the proportion of noise in a block as represented by the previously computed noise floor of that block.

Once the TDOA is estimated, a direction angle, which is associated with the audio sensor pair under consideration, is computed. This direction angle is defined as the angle between a line extending perpendicular to the baseline of the sensors from a point thereon (e.g., the aforementioned intersection point) and a line extending from this point to the apparent location of the speaker. The direction angle is estimated by computing the arcsine of the TDOA estimate multiplied by the speed of sound in air and divided by the length of the baseline of the audio sensor pair under consideration.

The aforementioned consensus location of the speaker is computed next. This involves identifying a mirror angle for the computed direction angle associated with each of pairs of synchronized audio sensors. The mirror angle is defined as the angle formed between the line extending perpendicular to the baseline of the audio sensor pair under consideration, and a reflection of the line extending from the baseline to the apparent location of the speaker on the opposite side of the baseline. Next, it is determined which of the direction angles associated with synchronized pairs of audio sensors and their mirror angles correspond to approximately the same direction. The consensus location is then defined as the angle obtained by computing a weighted combination of the direction and mirror angles determined to correspond to approximately the same direction. In general, the angles are assigned a weight based on how close the line extending from the baseline of the audio sensor pair associated with the angle to the estimated location of the speaker is to the line extending perpendicular to the baseline. The weight assigned is greater the closer these lines are to each other. One procedure for combining the weighted angles involves first converting the angles to a common coordinate system and then computing Gaussian probabilities to model each angle where $\mu$ is defined as the angle, and $\sigma$ is an uncertainty factor defined as the reciprocal of the cosine of the angle.

The Gaussian probabilities are combined via standard methods and the combined Gaussian representing the highest probability is identified. The angle associated with the highest peak is designated as the consensus angle. Alternately, a standard maximum likelihood estimation procedure can be employed to combine the weighted angles.

Finally, in regard to the portion of the speaker location process that involves refining the identified location of the person speaking, the following procedure is employed. A consensus location is computed as described above for each group of signal data blocks captured in the same sampling period and determined to contain human speech components, over a prescribed number of consecutive sampling periods. The individual computed consensus locations are then combined to produce a refined estimate. The consensus locations are combined using a temporal filtering technique, such median filtering, kalman filtering or particle filtering.

In addition to the just described benefits, other advantages of the present invention will become apparent from the detailed description which follows hereinafter when taken in conjunction with the drawing figures which accompany it.

DESCRIPTION OF THE DRAWINGS

The specific features, aspects, and advantages of the present invention will become better understood with regard to the following description, appended claims, and accompanying drawings where:

DETAILED DESCRIPTION OF THE PREFERRED EMBODIMENTS

In the following description of the preferred embodiments of the present invention, reference is made to the accompanying drawings which form a part hereof, and in which is shown by way of illustration specific embodiments in which the invention may be practiced. It is understood that other embodiments may be utilized and structural changes may be made without departing from the scope of the present invention.

As indicated previously, the present system and process involves the tracking the location of a speaker. Of particular interest is tracking the location of a speaker in the context of a distributed meeting and lecture. In a distributed meeting there are multiple, separated meeting rooms (hereafter referred to as sites) with one or more participants being located within each of the sites. In a distributed lecture there are typically multiple, separated lecture halls or classrooms (also hereinafter referred to as sites), with the lecturer being resident at one of the sites and the audience distributed between the lecturer's site and the other participating sites.

The foregoing sites are connected to each other via a video conferencing system. Typically, this requires a resident computer or server setup at each site. This setup is responsible for capturing audio and video using an appropriate video capture system and a microphone array, processing these audio/video (A/V) inputs (e.g., by using SSL or vision-based people tracking to ascertain the location of a current speaker), as well as compressing, recording and/or streaming the A/V inputs to the other sites via a distributed network, such as the Internet or a proprietary intranet. The requirement for any SSL technique employed in a distributed meeting or lecture is therefore for it to be accurate, real-time, and cheap to compute. There is also a not-so-obvious requirement on the hardware side. Given the audio capture cards available on the market today, synchronized multi-channel cards having more than two channels (e.g., a 4-channel sound card) are still quite expensive. To make the present system and process accessible to ordinary users, it is desirable that it work with the inexpensive sound cards typically found in most PCs (e.g., two 2-channel sound cards instead of one 4-channel sound card.).

Even though the present system and process for locating a speaker is designed to handle the demands of a real-time video conferencing application such as described above, it can also be used in less demanding applications, such as on-site intelligent camera management, video surveillance, speech recognition and speaker identification.

Figure 6:
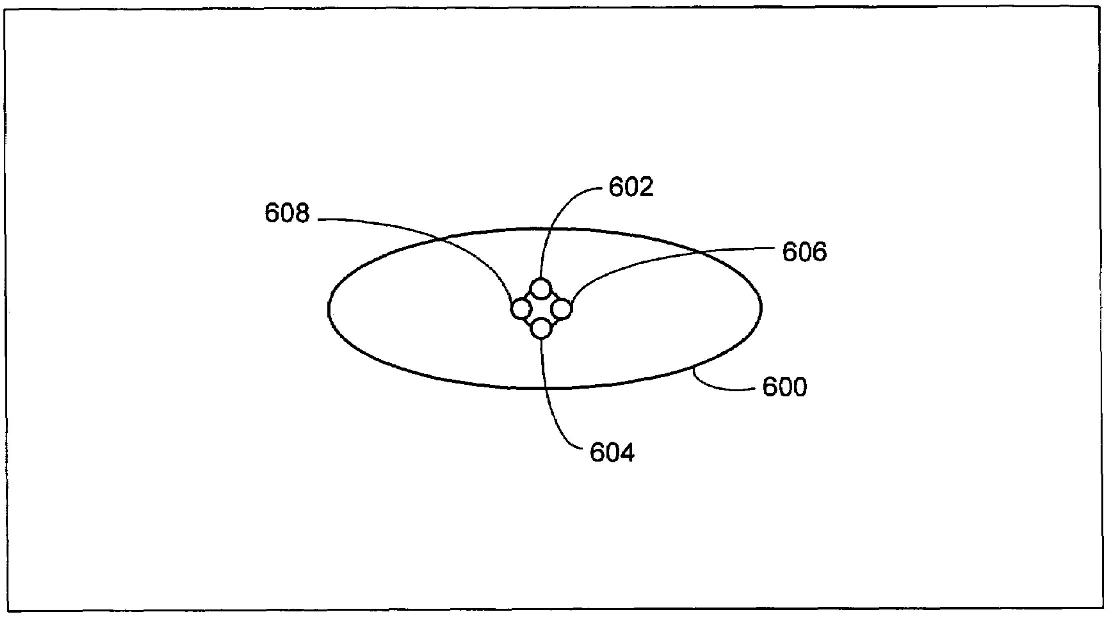
FIG. 6 is a diagram illustrating an example of a meeting room having a microphone array configuration with two pairs of audio sensors.

Also of particular interest especially in the context of a distributed meeting is the ability to locate the speaker by determining his or her direction anywhere in a 360 degree sweep about an arbitrary point which is preferably somewhere near the center of the room. In addition, it is desirable to accomplish this 360 location procedure using a single device—namely a single microphone array device. For example, the microphone array device could be placed in the center of the meeting room and the speaker can be located anywhere in a 360 degree region surrounding the array, as shown in FIG. 6. This is a significant advancement in SSL, as existing schemes are limited to detecting a speaker in an area swept-out 90 degrees or less from the microphone array. Thus, existing SSL schemes relegate that the array be place against a wall or in a corner of the meeting room, thereby limiting the location system's versatility. This is not the case with the location system of the present invention.

Figure 1:
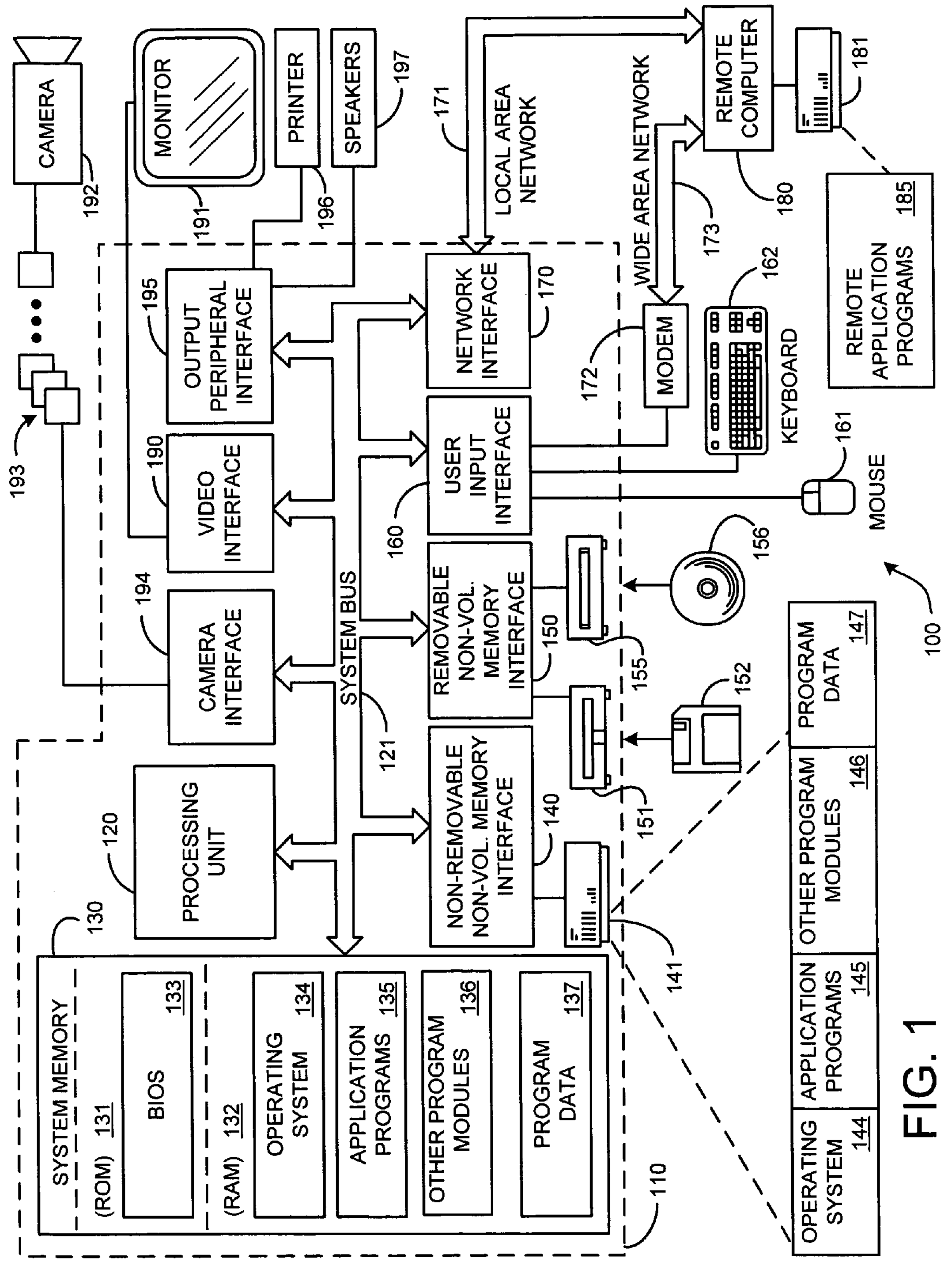
FIG. 1 is a diagram depicting a general purpose computing device constituting an exemplary system for implementing the present invention.

Before providing a description of the preferred embodiments of the present invention, a brief, general description of a suitable computing environment in which the invention may be implemented will be described. FIG. 1 illustrates an example of a suitable computing system environment 100. The computing system environment 100 is only one example of a suitable computing environment and is not intended to suggest any limitation as to the scope of use or functionality of the invention. Neither should the computing environment 100 be interpreted as having any dependency or requirement relating to any one or combination of components illustrated in the exemplary operating environment 100.

The invention is operational with numerous other general purpose or special purpose computing system environments or configurations. Examples of well known computing systems, environments, and/or configurations that may be suitable for use with the invention include, but are not limited to, personal computers, server computers, hand-held or laptop devices, multiprocessor systems, microprocessor-based systems, set top boxes, programmable consumer electronics, network PCs, minicomputers, mainframe computers, distributed computing environments that include any of the above systems or devices, and the like.

The invention may be described in the general context of computer-executable instructions, such as program modules, being executed by a computer. Generally, program modules include routines, programs, objects, components, data structures, etc. that perform particular tasks or implement particular abstract data types. The invention may also be practiced in distributed computing environments where tasks are performed by remote processing devices that are linked through a communications network. In a distributed computing environment, program modules may be located in both local and remote computer storage media including memory storage devices.

With reference to FIG. 1, an exemplary system for implementing the invention includes a general purpose computing device in the form of a computer 110, which can operate as part of the aforementioned resident computer or server setup at each site. Components of computer 110 may include, but are not limited to, a processing unit 120, a system memory 130, and a system bus 121 that couples various system components including the system memory to the processing unit 120. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 110 typically includes a variety of computer readable media. Computer readable media can be any available physical media that can be accessed by computer 110 and includes both volatile and nonvolatile media, removable and non-removable media. By way of example, and not limitation, computer readable media may comprise physical computer storage media. Computer storage media includes volatile and nonvolatile removable and non-removable media implemented in any physical method or technology for storage of information such as computer readable instructions, data structures, program modules or other data. Computer storage media includes physical devices such as, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other physical medium which can be used to store the desired information and which can be accessed by computer 110.

The system memory 130 includes computer storage media in the form of volatile and/or nonvolatile memory such as read only memory (ROM) 131 and random access memory (RAM) 132. A basic input/output system 133 (BIOS), containing the basic routines that help to transfer information between elements within computer 110, such as during start-up, is typically stored in ROM 131. RAM 132 typically contains data and/or program modules that are immediately accessible to and/or presently being operated on by processing unit 120. By way of example, and not limitation, FIG. 1 illustrates operating system 134, application programs 135, other program modules 136, and program data 137.

The computer 110 may also include other removable/non-removable, volatile/nonvolatile computer storage media. By way of example only, FIG. 1 illustrates a hard disk drive 141 that reads from or writes to non-removable, nonvolatile magnetic media, a magnetic disk drive 151 that reads from or writes to a removable, nonvolatile magnetic disk 152, and an optical disk drive 155 that reads from or writes to a removable, nonvolatile optical disk 156 such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 141 is typically connected to the system bus 121 through a non-removable memory interface such as interface 140, and magnetic disk drive 151 and optical disk drive 155 are typically connected to the system bus 121 by a removable memory interface, such as interface 150.

The drives and their associated computer storage media discussed above and illustrated in FIG. 1, provide storage of computer readable instructions, data structures, program modules and other data for the computer 110. In FIG. 1, for example, hard disk drive 141 is illustrated as storing operating system 144, application programs 145, other program modules 146, and program data 147. Note that these components can either be the same as or different from operating system 134, application programs 135, other program modules 136, and program data 137. Operating system 144, application programs 145, other program modules 146, and program data 147 are given different numbers here to illustrate that, at a minimum, they are different copies. A user may enter commands and information into the computer 110 through input devices such as a keyboard 162 and pointing device 161, commonly referred to as a mouse, trackball or touch pad. Other input devices (not shown) may include a microphone, joystick, game pad, satellite dish, scanner, or the like. These and other input devices are often connected to the processing unit 120 through a user input interface 160 that is coupled to the system bus 121, but may be connected by other interface and bus structures, such as a parallel port, game port or a universal serial bus (USB). A monitor 191 or other type of display device is also connected to the system bus 121 via an interface, such as a video interface 190. In addition to the monitor, computers may also include other peripheral output devices such as speakers 197 and printer 196, which may be connected through an output peripheral interface 195. Of particular significance to the present invention, a camera 163 (such as a digital/electronic still or video camera, or film/photographic scanner) capable of capturing a sequence of images 164 can also be included as an input device to the personal computer 110. Further, while just one camera is depicted, multiple cameras could be included as input devices to the personal computer 110. The images 164 from the one or more cameras are input into the computer 110 via an appropriate camera interface 165. This interface 165 is connected to the system bus 121, thereby allowing the images to be routed to and stored in the RAM 132, or one of the other data storage devices associated with the computer 110. However, it is noted that image data can be input into the computer 110 from any of the aforementioned computer-readable media as well, without requiring the use of the camera 163.

The computer 110 may operate in a networked environment using logical connections to one or more remote computers, such as a remote computer 180. The remote computer 180 may be a personal computer, a server, a router, a network PC, a peer device or other common network node, and typically includes many or all of the elements described above relative to the computer 110, although only a memory storage device 181 has been illustrated in FIG. 1. The logical connections depicted in FIG. 1 include a local area network (LAN) 171 and a wide area network (WAN) 173, but may also include other networks. Such networking environments are commonplace in offices, enterprise-wide computer networks, intranets and the Internet.

When used in a LAN networking environment, the computer 110 is connected to the LAN 171 through a network interface or adapter 170. When used in a WAN networking environment, the computer 110 typically includes a modem 172 or other means for establishing communications over the WAN 173, such as the Internet. The modem 172, which may be internal or external, may be connected to the system bus 121 via the user input interface 160, or other appropriate mechanism. In a networked environment, program modules depicted relative to the computer 110, or portions thereof, may be stored in the remote memory storage device. By way of example, and not limitation, FIG. 1 illustrates remote application programs 185 as residing on memory device 181. It will be appreciated that the network connections shown are exemplary and other means of establishing a communications link between the computers may be used.

The exemplary operating environment having now been discussed, the remaining part of this specification will be devoted to a description of the program modules embodying the invention.

Figure 2:
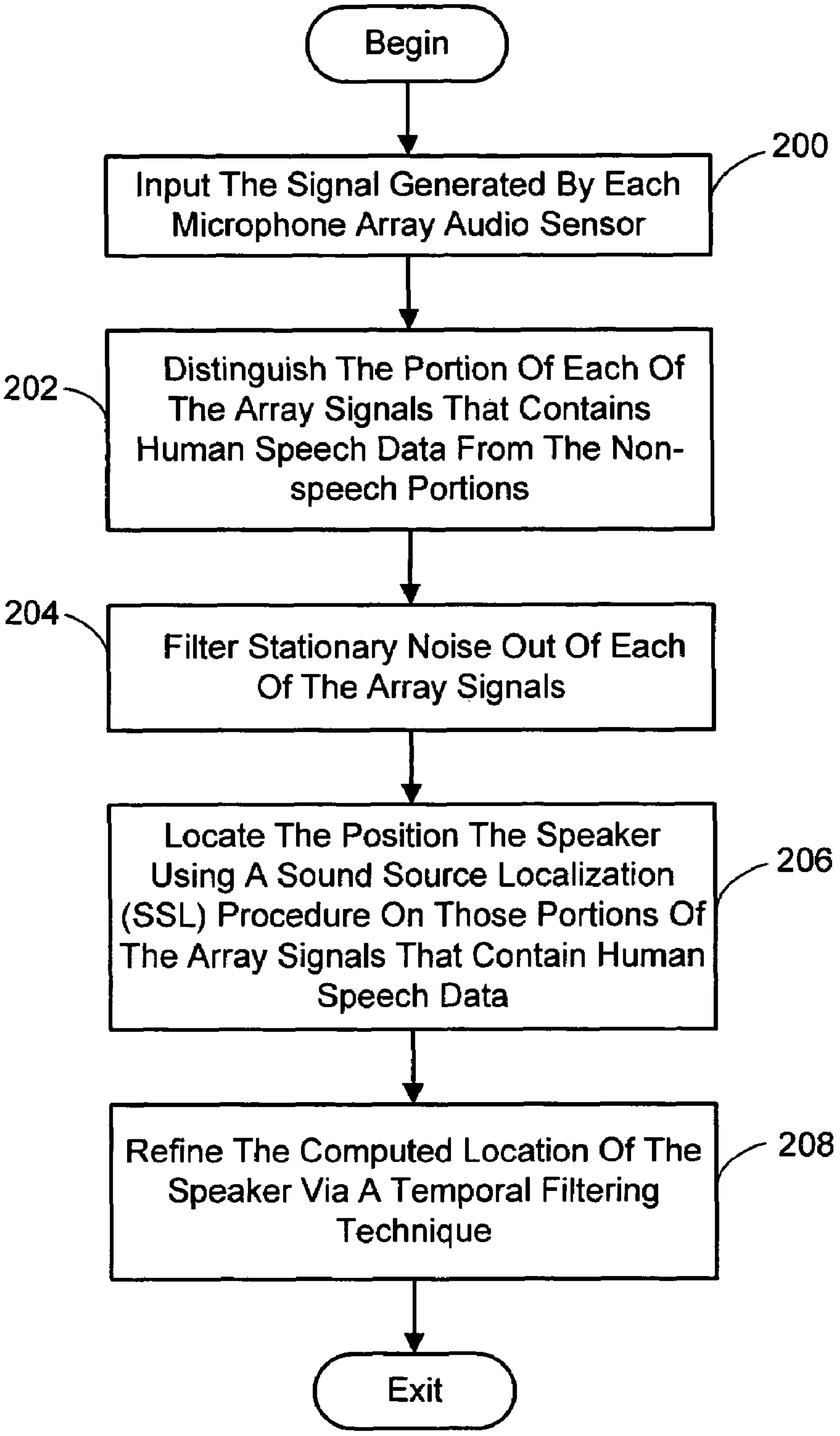
FIG. 2 is a flow chart diagramming an overall process for estimating the location of a speaker using signals output by a microphone array in accordance with the present invention.

Generally, the system and process according to the present invention involves using a microphone array to localize the source of an audio input, specifically the voice of a current speaker at a site. As mentioned previously, this is no easy task especially when there are multiple people at a site taking turns talking in rapid sequence or even at the same time. In general, this is accomplished via the following process actions, as shown in the high-level flow diagram of FIG. 2:

a) inputting the signal generated by each sensor of a microphone array resident at a site (process action 200);

b) distinguishing the portion of each of the array signals that contains human speech data from the non-speech portions using a speech classifier (process action 202);

c) reducing unwanted noise in each of the array signals using a Wiener filtering technique (process action 204);

d) locating the position of a desired or dominant speaker within the site using a robust, accurate and flexible Sound Source Localization (SSL) module for those portions of the array signals that contain human speech data (process action 206); and e) refining the computed location of the speaker via a temporal filtering technique (process action 208).

Each of the array signal processing actions (202 through 208) will be described in more detail in the sections to follow.

1.0 Speech Classification

Determining whether a block of filtered microphone array signal data contains human speech components, and eliminating those that do not from consideration, will substantially reduce or eliminate the effects of noise. In this way the upcoming SSL procedure will not be degraded by the presence of non-speech components of the signal. Additionally, performing a speech classification procedure before doing SSL has another significant advantage. Namely, it can drastically decrease the computation cost since the SSL module need only be activated when there is a human speech component present in the microphone array signals.

In general, for each signal data block, the speech classification procedure involves computing both the total energy of the block within the frequencies associated with human speech and the "delta" energy associated with that block, and then comparing these values to the noise floor as computed using conventional methods and the "delta" noise floor energy, to determine if human speech components exist within the block under consideration. The use of the "delta" energy is inspired by the observation that speech exhibits high variations in FFT values. The "delta" energy is a measure of this variation in energy. The classification goes on to identify if a block is merely noise and to update the noise floor and "delta" noise floor energy values. Finally, if it is unclear whether a block contains speech components or is noise, it is ignore completely in further processing. Thus, the speech classification procedure is a three classification that determines whether a block is a speech block, a noise block or an indeterminate block.

More particularly, each microphone array audio sensor signal is sampled to produce a sequence of consecutive blocks of the signal data representing the output of the sensor over a prescribed period of time. In tested versions of the speaker location system and process, 1024 samples were collected for approximately 23 ms (i.e., at a 44.1 khz sampling rate) to produce each block of signal data. Each block is then converted to the frequency domain. This can be done using a standard Fast Fourier Transform (FFT).

Figure 3A:
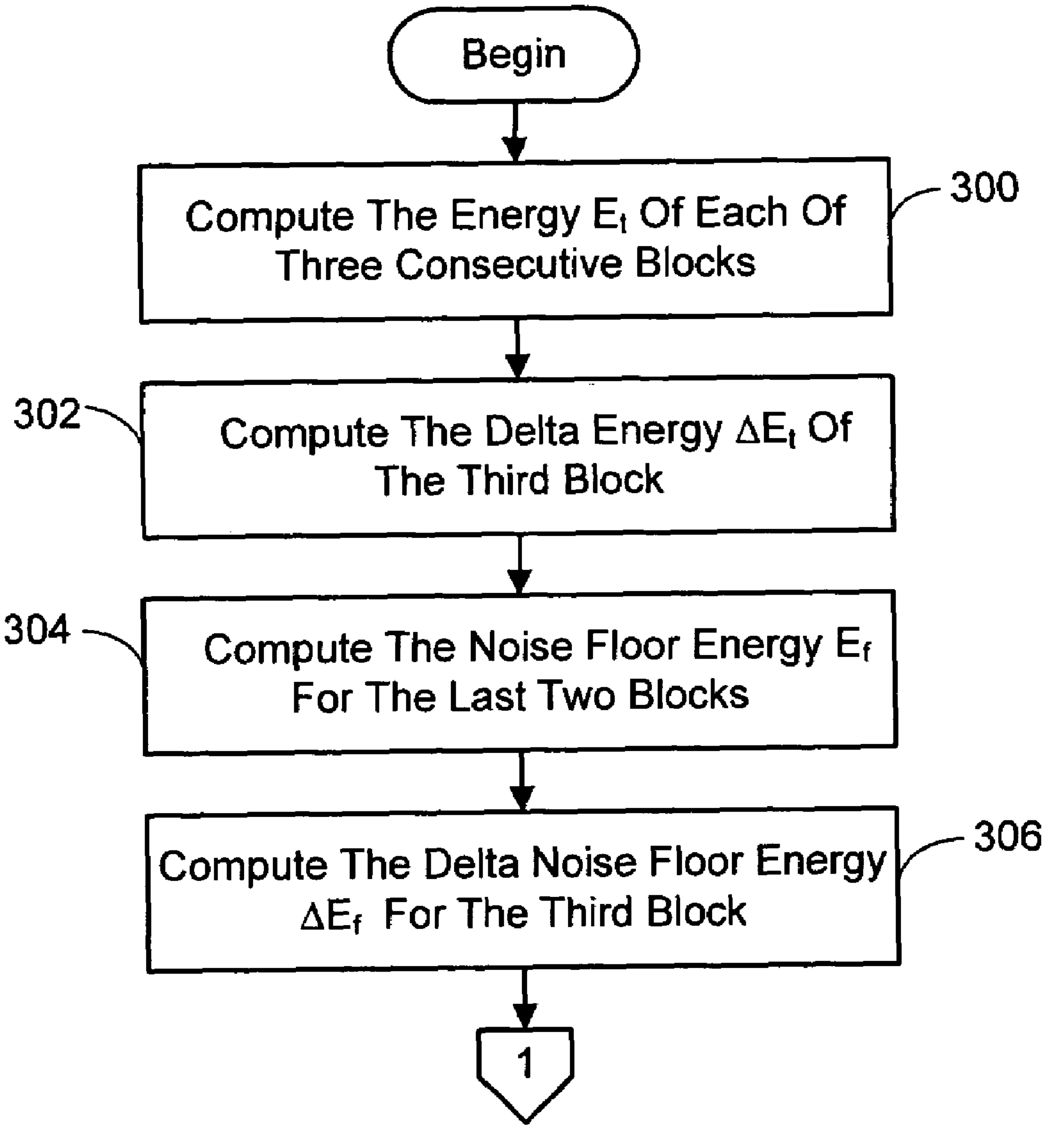
FIGS. 3A-B are flow charts diagramming a process for implementing the action of the overall process of FIG. 2 involving distinguishing the parts of the microphone array sensor signals containing human speech components from those parts of the signal that do not.

It is next determined whether the blocks contain human speech components. This first entails performing an initializing procedure on three consecutive blocks of the signal data, as outlined in FIG. 3A. The initialization begins by computing the energy $E_t(k)$ of each of the three blocks k across all the frequencies contained in the blocks using conventional methods (process action 300). Beginning with the third block of signal data, the "delta" energy $\Delta E_t(k)$ is also computed for the block (process action 302). The "delta" energy of the block $\Delta E_t(k)$ is the difference between the energy of a current signal block $E_t(k)$ and the energy computed for the immediately preceding signal block (i.e., $E_t(k-1)$). Thus, $$\Delta E_t(k)=E_t(k)-E_t(k-1) \tag{4}$$

$E_t(k)$ and $\Delta E_t(k)$ are complimentary in speech classification in that the energy $E_t(k)$ can be employed to identify low energy but high variance background interference, while $\Delta E_t(k)$ can be used to identify low variance but high energy noise. As such, the combination of these two factors provides good classification results, and greatly increases the robustness of the SSL procedure, at a decreased computation cost.

The energy of the noise floor $E_f$ is computed next using conventional methods beginning with the second block (process action 304). The energy of the noise floor $E_f$ is not computed until the second block is processed because it is based on an analysis of the immediately preceding block. Next, the "delta" energy of the noise floor $\Delta E_f$ is computed for the third block (process action 306). The "delta" energy of the noise floor $\Delta E_f$ is computed by subtracting the noise floor energy $E_f(k)$ computed in connection with the processing of the third block from the next previously computed noise floor energy (i.e., $E_f(k-1)$), which in this case is associated with the second block. Thus, $$\Delta E_f(k)=E_f(k)-E_f(k-1) \quad (5)$$

It is noted that this is why it is necessary to wait until processing the third block to compute the "delta" noise floor energy. It is also the reason why the "delta" energy is not computed until the third block is processed. Namely, as will become clear in the description of the main phase of the speech classification procedure to follow, the "delta" energy is not needed until the "delta" noise floor energy is computed.

Figure 3B:
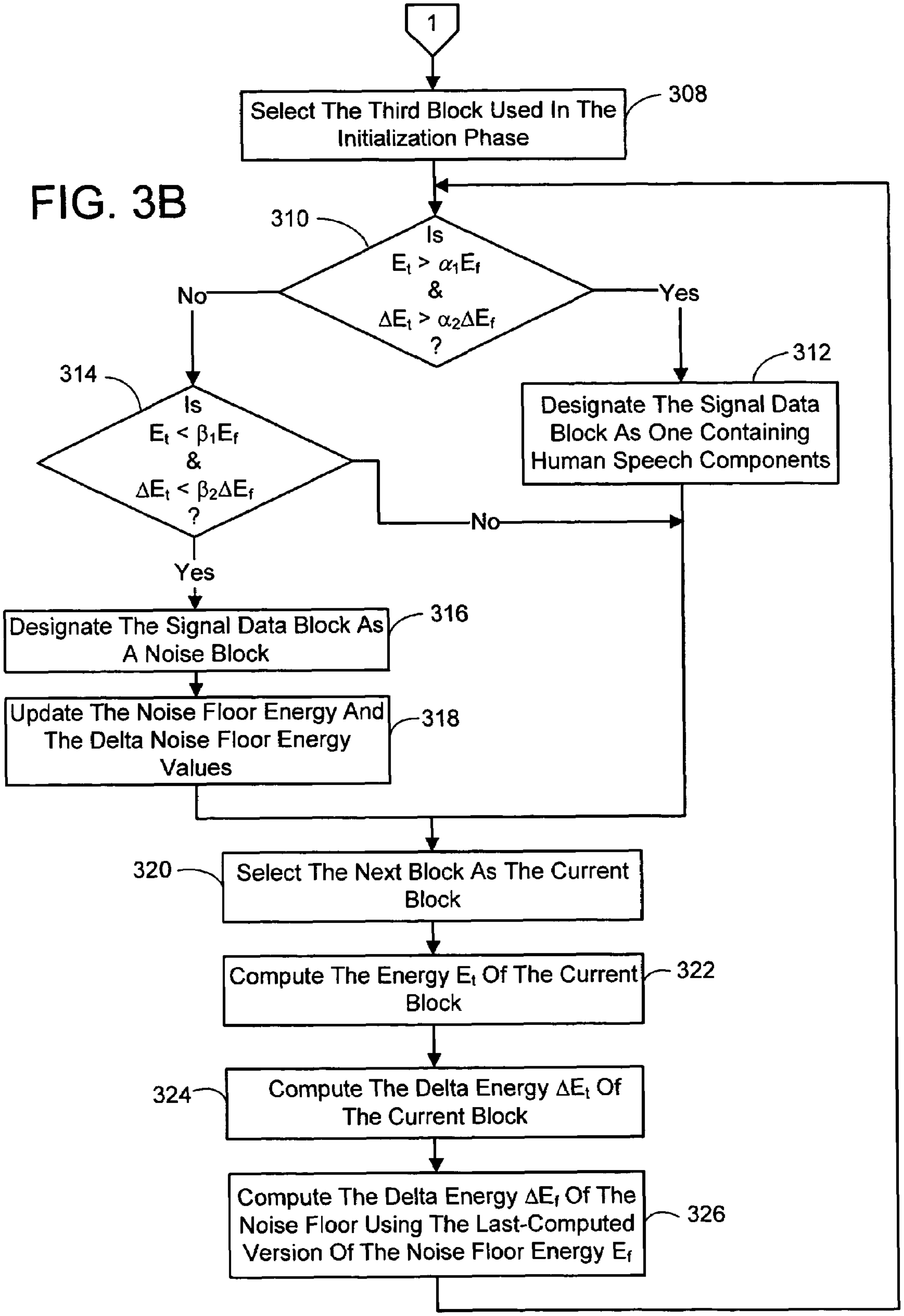

The initialization phase is followed by the main phase of the speech classification procedure, as outlined in FIG. 3B. More specifically, the last block involved in the initiation phase is selected for processing (process action 308), and it is determined if $E_t(k)$ exceeds a prescribed multiple ($\alpha_1$) of $E_f(k)$, and if $\Delta E_t(k)$ exceeds a prescribed multiple ($\alpha_2$) of $\Delta E_f(k)$ (process action 310). If both the block's $E_t(k)$ and $\Delta E_t(k)$ values exceed their respective $E_f(k)$ and $\Delta E_f(k)$ multiples, then the block is designated as one containing human speech components (process action 312). In tested versions of the present speaker location system and process, it was found that setting the prescribed multiples $\alpha_1$ and $\alpha_2$ to values ranging between about 3.0 and about 5.0 produce satisfactory results. However, other values could be employed depending on the application. If the foregoing conditions are not simultaneously satisfied, a second comparison is performed. In this second comparison, it is determined if $E_t(k)$ is less than a prescribed multiple ($\beta_1$) of $E_f(k)$, and if $\Delta E_t(k)$ is less than a prescribed multiple ($\beta_2$) of $\Delta E_f(k)$ (process action 314). If both the block's $E_t(k)$ and $\Delta E_t(k)$ values are less than their respective $E_f(k)$ and $\Delta E_f(k)$ multiples, then the block is designated as one being noise (process action 316). In this case, it was found that setting the prescribed multiples $\beta_1$ and $\beta_2$ to values ranging between about 1.5 and about 2.0 produce satisfactory results. However, again other values could be employed depending on the application.

Whenever a block of signal data is designated as being noise, the current noise floor energy value and the associated "delta" noise floor energy value are updated (process action 318) as follows. If the noise level is increasing, i.e., $E_t(k) > E_t(k-1)$, then:

$$E_f(k)_{new}=(T_1)E_f(k)_{current}+(1-T_1)E_f(k)_{current} \quad (6)$$

$$\Delta E_f(k)_{new}=(T_1)\Delta E_f(k)_{current}+(1-T_1)\Delta E_f(k)_{current} \quad (7)$$

where $T_1$ is a number smaller than, but very close to 1.0 (e.g., 0.95 was used in tested versions of the present system and process). However, if the noise level is decreasing, i.e., $E_t(k)<E_t(k-1)$, then:

$$E_f(k)_{new}=(T_2)E_f(k)_{current}+(1-T_2)E_f(k)_{current} \quad (8)$$

$$\Delta E_f(k)_{new}=(T_2)\Delta E_f(k)_{current}+(1-T_2)\Delta E_f(k)_{current} \quad (9)$$

where $T_2$ is a number larger than, but very close to 0 (e.g., 0.05 was used in tested versions of the present system and process). In this way, the noise floor level is adaptively tracked for each new block of signal data processed. It is noted that the choice of the $T_1$ and $T_2$ values ensures the noise floor track will gradually increase with increasing noise level and quickly decrease with decreasing noise level.

In the case where it is found that the $E_t(k)$ and $\Delta E_t(k)$ values of the signal block under consideration are neither both greater nor both less than the respective assigned multiples of $E_f(k)$ and $\Delta E_f(k)$, it is not clear whether the block contains speech components or represents noise. In such a case the block is ignored and no further processing is performed, as shown in FIG. 3B.

The speech classification process continues with the processing of the next block of the sensor signal under consideration, by first selecting the block as the current block (process action 320). The energy $E_t(k)$ of the current signal block k is then computed (process action 322), as is the "delta" energy $\Delta E_t(k)$ of the current signal block (process action 324), in the manner described previously. Using the last-computed version of the noise floor energy, the "delta" energy of the noise floor $\Delta E_f(k)$ is computed (process action 326), in the manner described previously. The previously-described comparisons and designations (i.e., process actions 310 through 316) are then performed again for the current block of signal data. In addition, if the block is designated as a noise block in process action 316, the noise floor energy is updated again as indicated in process action 318. The classification process is then repeated starting with process action 320 for each successive block of the sensor signal under consideration.

2.0 Wiener Filtering

Even though it has been determined that a block contains human speech components, there is always noise in meeting and lecture rooms emanating from, for example, computer fans, projectors, and other on-site and outside sources, which will distort the signal. These noise sources will greatly interfere with the accuracy of the SSL process. Fortunately, most of these interfering noises are stationary or short-term stationary noises (i.e., the spectrum does not change much with time). This makes it possible to collect noise statistics on the fly, and use a Wiener filtering procedure to filter out the unwanted noise.

More specifically, first, for each block of signal data captured from the microphone array audio sensors that has been designated as containing human speech components, a bandpass filtering operation is performed which eliminates those frequencies not within the human speech range (i.e., about 300 hz to about 3000 hz). Next, note that a previously speech-classified signal block from each sensor of the microphone array will be a combination of the desired speech and noise, i.e. in the frequency domain:

$$x(f)=s(f)+N(f) \quad (10)$$

where x(f) is an array signal transformed into the frequency domain via a standard fast Fourier transform (FFT) process, s(f) is the desired non-noise component of the transformed array signal and N(f) is the noise component of the transformed array signal.

Given the foregoing characterization, the job of the Wiener filtering is to recover s(f) from x(f). Note that if x(f)=s(f)+N(f) then:

$$E_t(k)=E_s(k)+E_N(k) \qquad (11)$$

where $E_t(k)$ is the total energy of the microphone array signal block under consideration, $E_s(k)$ is energy of the non-noise component of the signal and $E_N(k)$ is the energy of the noise component of the signal, and assuming there is no correlation between the desired signal components and the noise. The noise energy can be reasonably estimated as being equal to the noise floor energy associated with the block under consideration, as computed during the speech classification procedure. Thus, $E_N(k)$ is set equal to $E_f(k)$.

Figure 4:
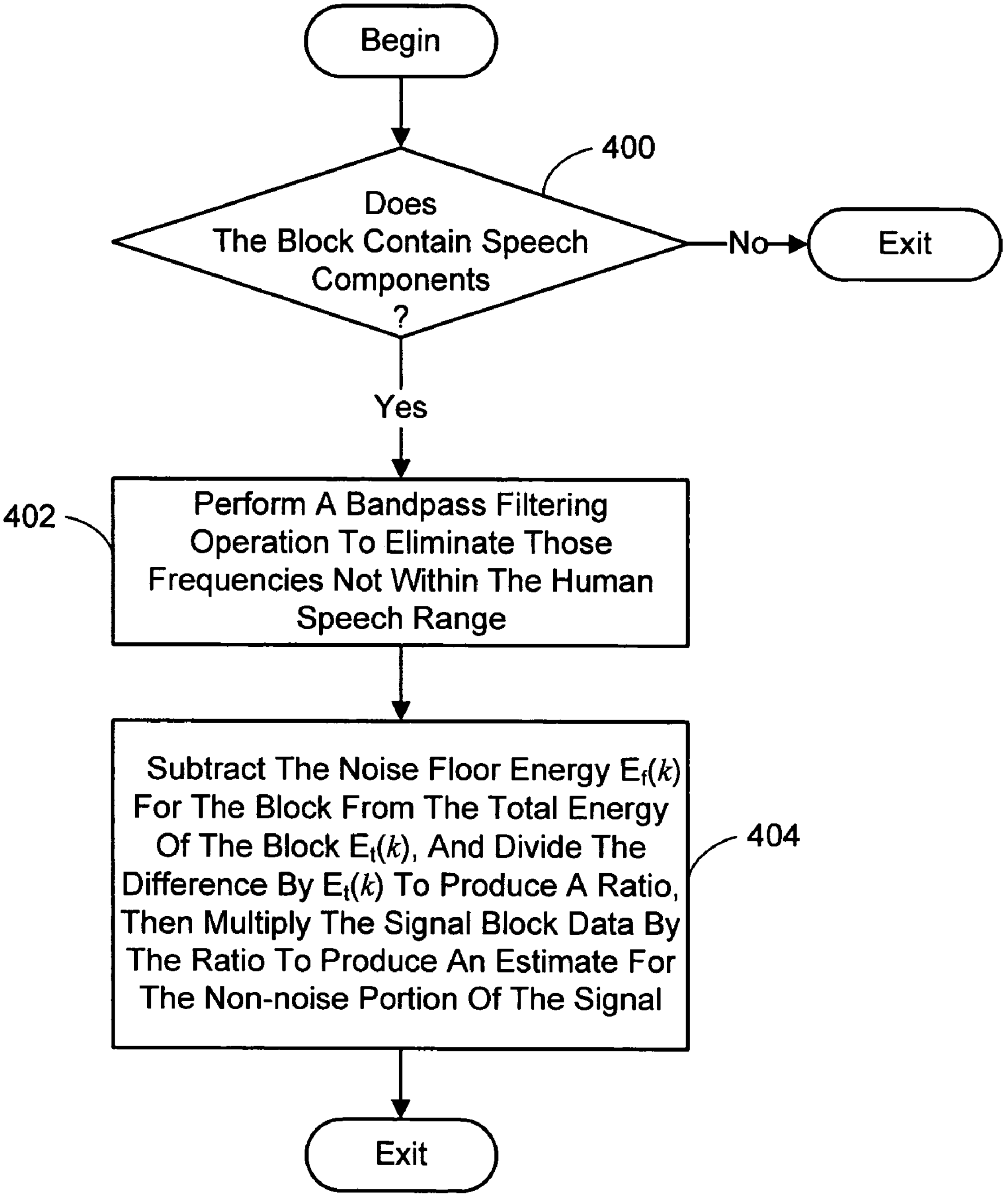
FIG. 4 is a flow chart diagramming a process for implementing the stationary noise filtering action of the overall process of FIG. 2.

Given the above conditions, the Wiener filter solution for the non-noise signal component s(f) estimate is:

$$\hat{s}(f) = \frac{E_s(k)}{E_s(k)+E_N(k)}\cdot x(f) = \frac{E_t(k)-E_N(k)}{E_t(k)}\cdot x(f) \qquad (12)$$

where ŝ(f) is the estimated desired non-noise signal component. This filtering process is summarized in the flow diagram of FIG. 4. First, in process action 400, for each block of signal data captured from the microphone array audio sensors, it is determined if the block has been designated as containing human speech components. If not, the block is ignored. However, if the block contains human speech components, a bandpass filtering operation is performed which eliminates those frequencies not within the human speech range (process action 402). Next, in process action 404, the noise floor energy $E_f(k)$ computed for the block under consideration is subtracted from the total energy of the block $E_t(k)$, and the difference is divided by $E_t(k)$ to produce a ratio that represents the percentage of the signal block attributable to non-noise components, and which is multiplied by the signal block data is multiplied to produce the desired estimate the non-noise portion of the signal ŝ(f).

Once the non-noise portion ŝ(f) of each contemporaneously captured block of array signal data designated as being a speech block has been estimated, the filtering operation for those blocks is complete and the filtered signal data of each block is next processed by the aforementioned SSL module, which will be described next. Meanwhile, the Weiner filtering module continues to process each contemporaneously captured set of signal data blocks from the incoming microphone array signals as described above.

3.0 Sound Source Localization (SSL) Procedure

The present speaker location system and process employs a modified version of the previously described time-delay-of-arrival (TDOA) based approaches to sound source localization. As described previously, TDOA-based approaches involve two general phases—namely a time delay estimation (TDE) phase and a location phase. In regard to the TDE phase of the procedure, the present speaker location system and process adopts the generalized cross-correlation (GCC) approach [Wan97], described previously and embodied in Eqs. (1) and (2). However, a different approach to establishing the weighting function has been developed.

As described previously, choosing the right weighting function is of great significance for achieving accurate and robust time delay estimation. It is easy to see that ML and PHAT weighting functions are at two extremes. That is, $W_{ML}(w)$ puts too much emphasis on "noiseless" frequencies, while $W_{PHAT}(w)$ treats all the frequencies equally. To simultaneously deal with background noise and reverberations, a modified technique expanding on the procedure described in [Wan97] is employed. More specifically, the technique starts with $W_{ML}(w)$, which is the optimum solution in non-reverberation conditions. To incorporate reverberations, generalized noise is defined as follows:

$$\|N'(\omega)\|^2=\|H(\omega)\|^2\|s(\omega)\|^2+\|N(\omega)\|^2 \qquad (13)$$

Assuming the reverberation energy is proportional to the signal energy, the following weighting function applies:

$$W(\omega) = \frac{1}{\gamma\,\|G_{X_1X_2}(\omega)\|^2+(1-\gamma)\,\|NB(\omega)\|^2} \qquad (14)$$

where $\gamma \in [0,1]$ is the proportion factor. In tested versions of the present speaker location system and process, the proportion factor γ was set to a fixed value of 0.3. This value was chosen to handle a relatively noise heavy environment. However, other fixed values could be used depending on the anticipated noise level in the environment in which the location of a speaker is to be tracked. Additionally, a dynamically chosen proportion factor value can be employed rather than a fixed value, so as to be more adaptive to changing levels of noise in the environment. In the dynamic case, the proportion factor would be set equal to the proportion of noise in a block as represented by the previously computed noise floor of that block.

Figure 5:
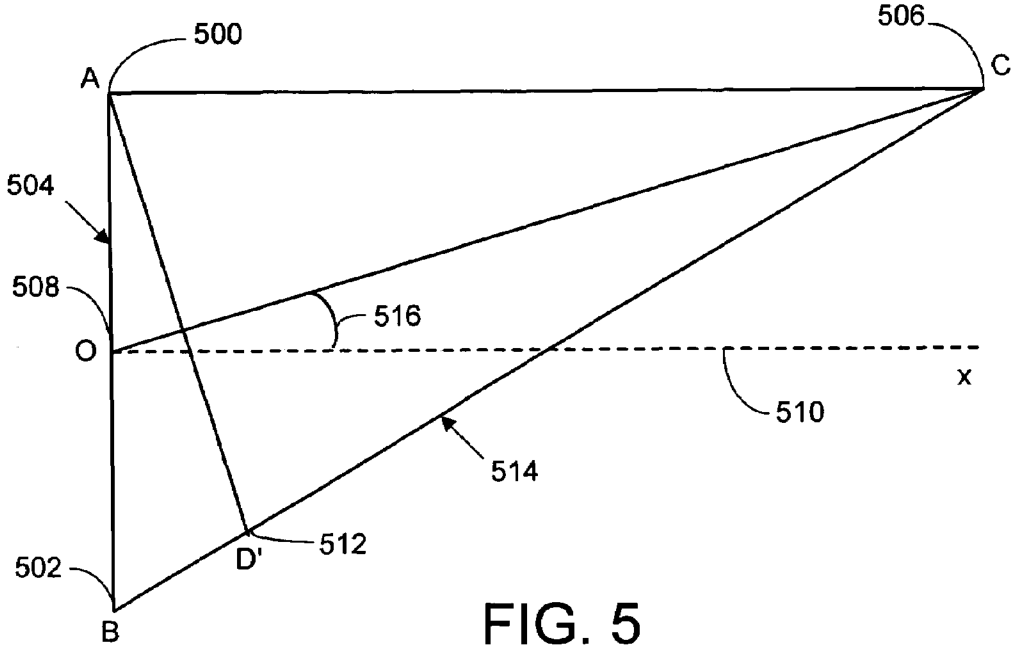
FIG. 5 is a diagram generally illustrating the microphone array's geometry for a pair of audio sensors.

Once the time delay D is estimated as described above, the sound source direction is estimated given the microphone array's geometry in the location phase of the procedure. As shown in FIG. 5, let two sensors of the microphone array be at locations A (500) and B (502), as viewed from above the meeting or lecture space. The line AB (504) connecting the sensor locations 500, 502 is called the baseline of the microphone array sensor pair. Also, let C (506) be the location of the speaker who is being tracked. Further, assume the active camera of the video conferencing system is at location O (508), and that its optical axis "x" (510) is directed perpendicular to line AB. And finally, let location D' (512) correspond to the distance along line BC (514) from sensor location B (502) that is responsible for creating the aforementioned time delay D between the microphone array sensors at locations A (500) and B (502).

The goal of the SSL procedure is to estimate the angle ∠COX (516) so that the active camera can be pointed in the direction of the speaker. When the distance of the target, i.e., |OC|, is much larger than the length of the baseline |AB|, the angle ∠COX (516) can be estimated as follows:

$$\angle COX \approx \angle BAD' = \arcsin\frac{|BD'|}{|AB|} = \arcsin\frac{D\times v}{|AB|} \qquad (15)$$

where v=342 m/s is the speed of sound traveling in air.

It is noted that the camera need not actually be located at C with its optical axis aligned perpendicular to the line AB. Rather, by making this assumption it is possible to compute the angle ∠COX. As long as the location of the camera and the current direction of its optical axis is known, the direction that the camera needs to point to bring the speaker within its field of view can be readily calculated using conventional methods once the angle ∠COX is known.

However, the foregoing procedure results in a 180 degree ambiguity. That is, for a single pair of sensors in the microphone array, it is not possible to distinguish if the sound is coming from one side or the other of the baseline. Thus, the actual result could be as calculated, or it could be the mirror angle on the other side of the baseline connecting the sensor pair. This is not a problem in traditional video conferencing systems where the camera and microphone array is placed against one wall of the meeting room or lecture hall. In this scenario any ambiguity is resolved by eliminating the solution that places the speaker behind the video conferencing equipment. However, having to place the conferencing equipment in a prescribed location within the room or hall can be quite limiting. It would be more desirable to be able to place the camera or cameras, and the audio sensors of the microphone array, at locations around the room or hall so as to improve the ability of the system to track the speaker and provide more interesting views of the participants. An example (let's delete B) of such a configuration for a meeting room having a microphone array with two pairs of audio sensors is shown in FIG. 6. In the configuration depicted in FIG. 6, an overhead view of a meeting room where a camera (not shown) of the video conferencing system is placed in the middle of a conference table 600 or hung from the ceiling in the middle of the room, where it can provide a nearly frontal view of any of the participants. In this configuration, the sensors 602, 604, 606,608 of the microphone array are located in the center of the conference room table. The foregoing video conferencing setups could also employ one or more cameras mounted to a wall of the room. This flexibility in the placement of the camera or cameras, and the audio sensors of the microphone array comes at a cost though. It requires a SSL procedure that can effectively locate a speaker anywhere in the room, even if behind the active camera. One way of accomplishing this is to require the SSL procedure to be able to locate a speaker by determining his or her direction in terms of a direction angle anywhere in a 360 degree sweep about an arbitrary point which is preferably somewhere near the center of the room.

Figure 7:
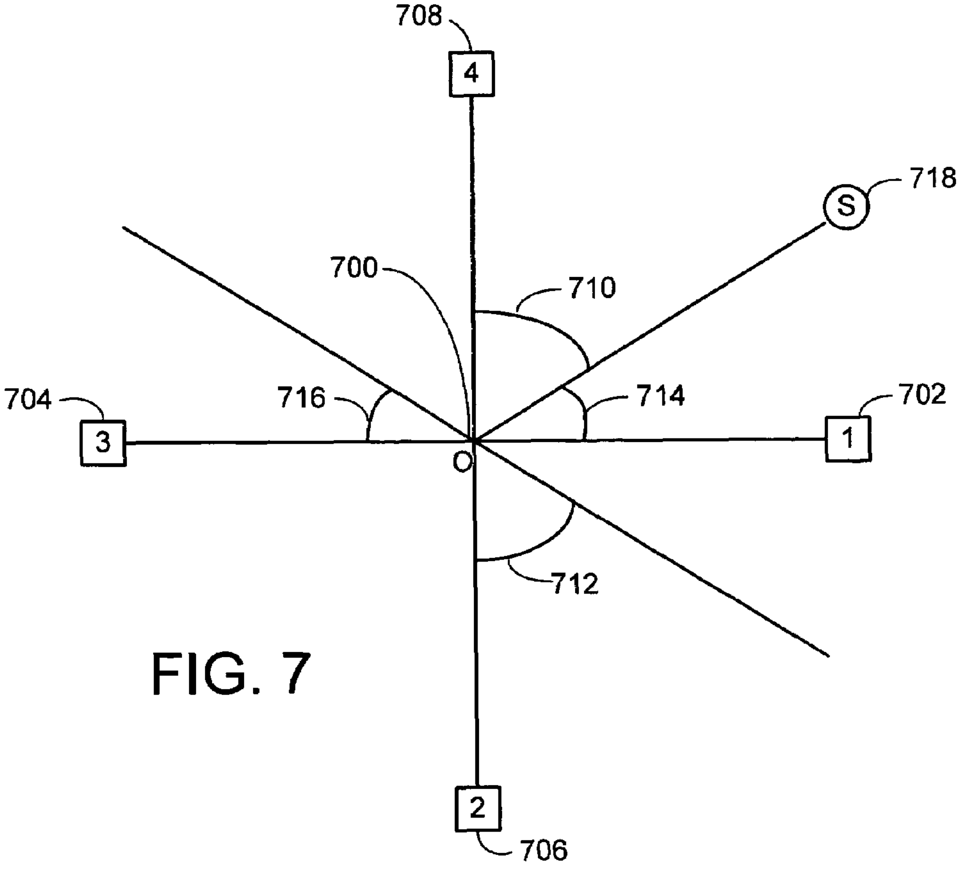
FIG. 7 is a diagram illustrating the idealized results of locating a speaker using two pairs of diametrically opposed audio sensors in terms of direction angles, along with the associated mirror angles resulting from the ambiguity in the location measurement process.

In order to achieve this so-called 360 degree SSL, it is necessary to find a new way to resolve the aforementioned ambiguity. In the present speaker location system and process this is accomplished by including at least two pairs of microphone array audio sensors in the space. For example, FIG. 7 diagrams the geometric relationships between a camera and microphone array having two pairs of diametrically opposed sensors (i.e., sensor pair 1 (702) and 3 (704), and sensor pair 2 (706) and 4 (708)) as viewed from above. Ideally, the second pair of array sensors 706, 708 would be located such that the line connecting them is perpendicular to the line connecting the first pair 702, 704 (as shown in FIG. 7), although this is not an absolute necessity. The SSL procedure described above is also performed using the second pair of sensors, assuming the camera is at the same location—preferably in the center of the of the microphone array. The result is four possible angles 710, 712, 714, 716 (i.e., $\theta_{1,3}$, $\theta'_{1,3}$, $\theta_{2,4}$, $\theta'_{2,4}$) that could define the direction of the speaker from the assumed camera location O 700. However, two of these angles will describe substantially same direction—namely $\theta_{1,3}$ (710) and $\theta_{2,4}$ (714). This is the actual direction of the speaker "S" (718) from the assumed camera location O (700). All the other possible directions can then be eliminated and the ambiguity is resolved.

The two-pair configuration of the microphone array has other significant advantages beyond just resolving the ambiguity issue. In order to ensure that the blocks of signal data that are captured from a sensor in the microphone array are contemporaneous with another sensor's output, the sensors have to be synchronized. Thus, in the two-pair microphone array configuration, each pair of sensors used to compute the direction of the speaker must be synchronized. However, the individual sensor pairs do not have to be synchronized with each other. This is a significant feature because current sound cards used in computers, such as a PC, that are capable of synchronizing four separate sensor input channels are relatively expensive, and could make the present system too costly for general use. However, current sound cards that are capable of synchronizing two sensor input channels (i.e., so-called stereo pair sound cards) are quite common and relatively inexpensive. In the present two-pair microphone array configuration all that is needed is two of these stereo pair sound cards. Including two such cards in a computer is not such a large expense that the system would be too costly for general use.

In testing of the present speaker location system and process, a very significant discovery was made that the resolution and robustness of TDOA estimation procedure is angle dependent. That is, if a sound is coming from a direction closer to a direction perpendicular to the baseline of one of the microphone array's sensor pairs, the resolution is higher and estimation is more robust. Whereas, if a sound is coming from a direction closer to a direction parallel to the baseline of one of the microphone array's sensor pairs, the resolution is lower and the estimation is not as trustworthy. This phenomenon can be shown mathematically as follows. Performing a sensitivity analysis using Eq. 15 shows that:

$$\sin\theta = \frac{D \times v}{|AB|} = \frac{k/f \times v}{|AB|} = c \cdot k \tag{16}$$

$$\cos\theta \cdot d\theta = c \cdot dk$$

$$d\theta = \frac{1}{\cos\theta} c \cdot dk$$

where k is the sample shifts, f is the sampling frequency, and c is a constant. Plugging in some numbers yields:

$$d\theta\,|_{\theta=0} = \frac{1}{\cos\theta} c \cdot dk = c \cdot dk$$

$$d\theta\,|_{\theta=30} = \frac{1}{\cos\theta} c \cdot dk = 1.414 c \cdot dk$$

$$d\theta\,|_{\theta=60} = \frac{1}{\cos\theta} c \cdot dk = 2 c \cdot dk$$

$$d\theta\,|_{\theta=80} = \frac{1}{\cos\theta} c \cdot dk = 5.78 c \cdot dk$$

$$d\theta\,|_{\theta=90} = \frac{1}{\cos\theta} c \cdot dk = \infty c \cdot dk$$

Thus, when θ goes from 0 to 90 degrees, the estimation uncertainty increases. And when θ is 90 degrees, the uncertainty is infinity, which means the estimation should not be trusted at all.

The foregoing phenomenon can be used to enhance the accuracy of the present speaker location system and process. Generally, this is accomplished by combining the two direction angles associated with the individual microphone array sensor pairs that were deemed to correspond to the same general direction. This combining procedure involves weighting the angles according to how close the direction is to a line perpendicular to the baseline of the sensor pair. One way of performing this task is to use a conventional maximum likelihood estimation procedure as follows. Let $\theta_i$ be the true angle for sensor pair i, and $\hat{\theta}_i$ be the estimated angle from this pair. The maximum likelihood solution of the consensus angle is then:

$$J = \max \sum_i \frac{(\theta_i - \hat{\theta}_i)^2}{\sigma^2} \tag{15}$$

Figure 8:
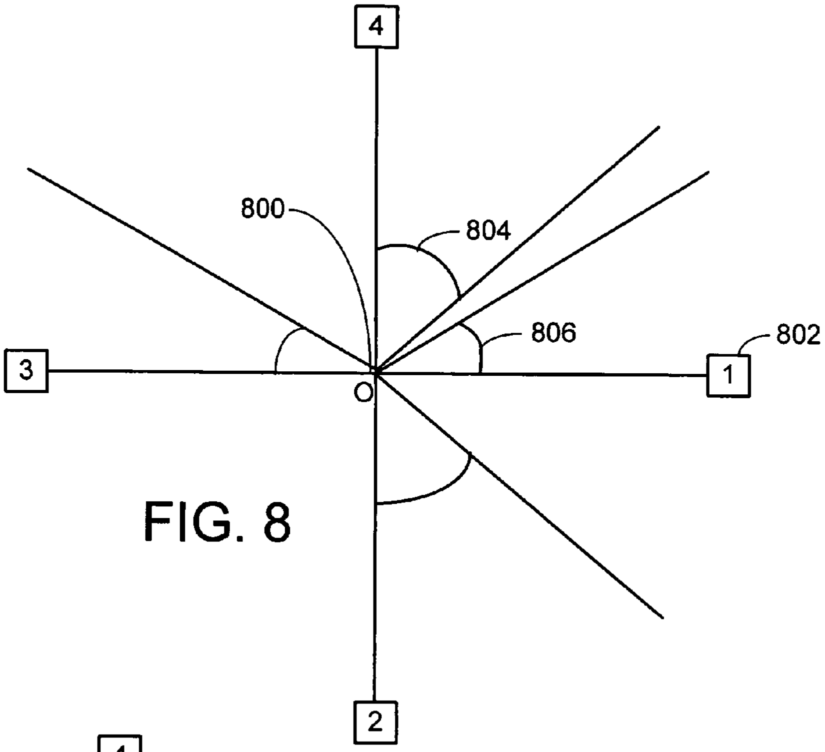
FIG. 8 is a diagram illustrating exemplary results of locating a speaker using two pairs of diametrically opposed audio sensors in terms of direction angles and the associated mirror angles, where the direction angles estimated from the signals of the individual audio sensor pairs do not exactly match.
Figure 9:
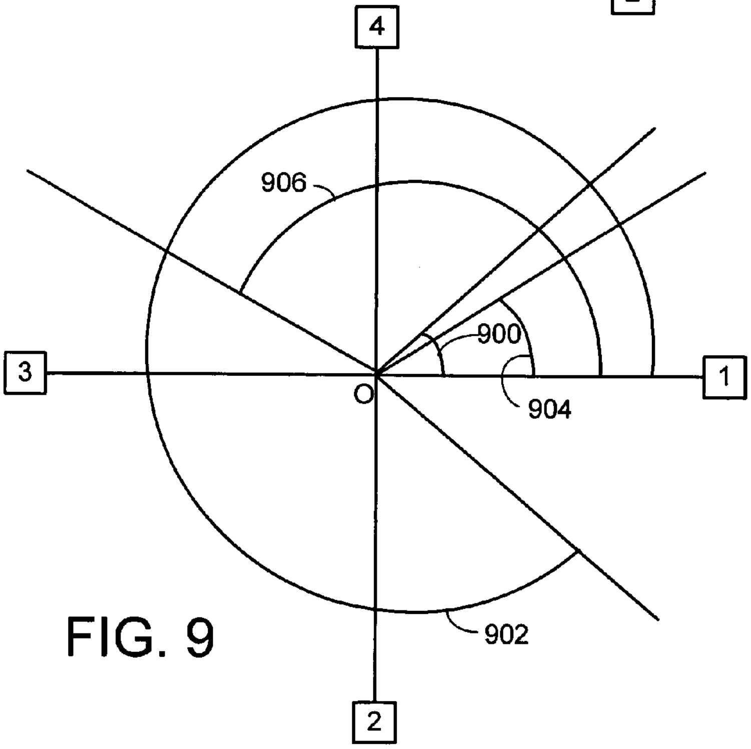
FIG. 9 is a diagram illustrating the exemplary results of FIG. 8 in terms of a common coordinate system.

Another method of combining the results of the SSL procedure described above to produce a more accurate direction angle θ will now be described. In this alternate procedure all the direction angles, ambiguous or not, which were computed for each pair of microphone array sensors can be employed as in the following example (or alternately just those found to correspond roughly to the same direction can be involved). Take as an example a case where the direction angle $\theta_{1,3}$ (804) computed using the above-described SSL procedure was 45 degrees and the direction angle $\theta_{2,4}$ (806) was 30 degrees, as shown in FIG. 8. These angles are first converted to a global coordinate system, such as shown in FIG. 9 where 0 degrees starts at the line connecting the assumed camera location O and the location of sensor 1, and increases in the counter-clockwise direction. In the global coordinate system, $\theta_{1,3}$ (900) would be 45 degrees (with a mirror angle 902 of 315 degrees) and $\theta_{2,4}$ (904) would still be 30 degrees (with a mirror angle 906 of 150 degrees).

Figure 10:
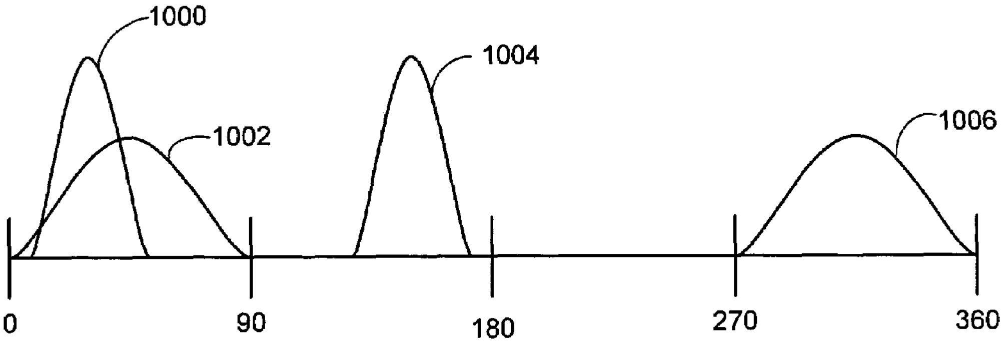
FIG. 10 shows the example angles of FIG. 9 plotted as Gaussian curves centered at the estimated angle and having widths and heights dictated by the uncertainty factor.
Figure 11:
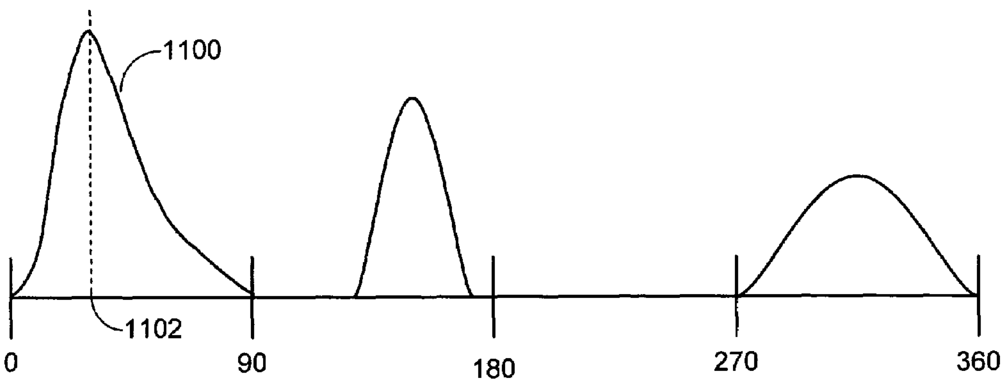
FIG. 11 shows the Gaussian curves plotted in FIG. 10 in a combined form.

A Gaussian distribution model is used to factor in the uncertainty in the direction angle measurements, with μ being the estimated direction angle θ and σ=1/(cos θ) being the uncertainty factor. FIG. 10 shows the foregoing example angles plotted as Gaussian curves 1000, 1002, 1004, 1006 centered at the estimated angle θ and having widths and heights dictated by the uncertainty factor. Notice that angles having a higher uncertainty have Gaussian curves 1002, 1006 that are wider and shorter (which in this case are the 45 degree and 315 degree angles), while angles having a lower uncertainty exhibit Gaussian curves 1000, 1004 that are narrower and taller (which in this case are the 15 degree and 150 degree angles). The Gaussian probabilities are combined via conventional means to determine the final direction angle estimate. FIG. 11 shows the combined Gaussian probabilities as combined curves. The Gaussian with the highest probability 1100 (i.e., the tallest curve in FIG. 11) is selected and the direction angle associated with the combined probability 1102 (i.e., the angle associated with the peak of the tallest curve in FIG. 11) is designated as the final estimate for the direction angle. In the example of FIG. 11, the final estimated angle is about 35 degrees. It is noted that the Gaussian curve associated with the mirror angles, which in this case represent the angles that do not approximately correspond to the same direction as another of the direction angles, will never be combined with the Gaussian curve of another in a two sensor-pair configuration. Thus, they could be eliminated from the foregoing computations prior to computing the combined Gaussians if desired.

While a configuration having two pairs of synchronized audio sensors was used in the foregoing description of the present SSL procedure, it is noted that more pairs could also be added. For example, in the case where the video conferencing system is installed in a lecture hall, the size of the space may require more than just two synchronized pairs to adequately cover the space. Generally, any number of synchronized audio sensor pairs can be employed. The SSL procedure would be the same except that the direction angles computed for each sensor pair that corresponds to the same general direction would all be weighted and combined to produce the final angle.

Figure 12:
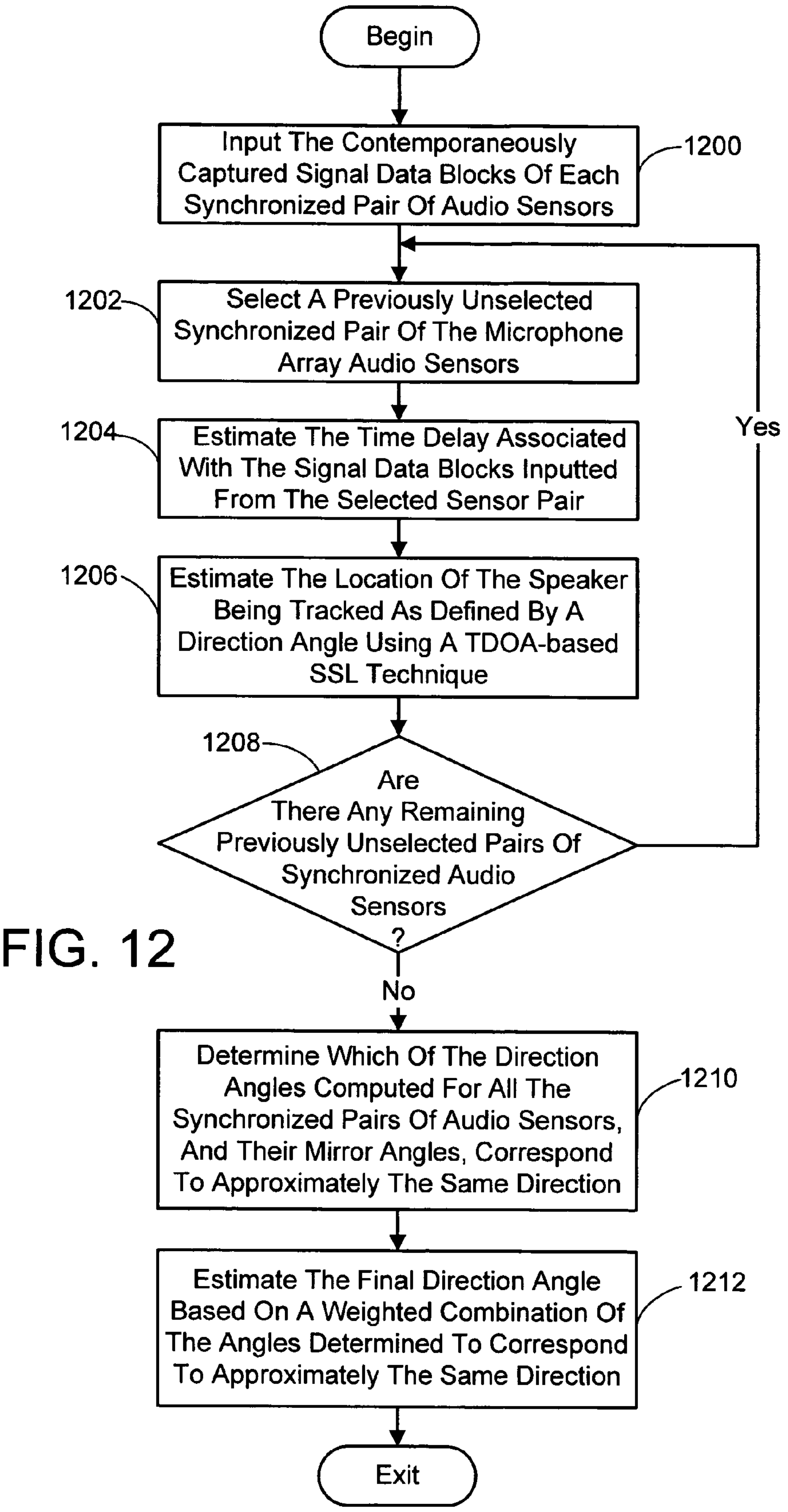
FIG. 12 is a flow chart diagramming a process for implementing the SSL action of the overall process of FIG. 2.

Thus, referring to FIG. 12, the SSL procedure according to the present invention can be summarized as follows. First, contemporaneously captured blocks of signal data output from each synchronized pair of audio sensors of the microphone array are input (process action 1200). It is noted that the blocks of signal data input from one synchronized pair of sensors may not be exactly contemporaneous with the blocks input from a different synchronized sensor pair. However, this does not matter in the present SSL procedure as discussed previously. The next process action 1202 entails selecting a previously unselected synchronized pair of the microphone array audio sensors. The time delay associated with the blocks of signal data inputted from the selected sensor pair is then estimated (process action 1204). In one version of the SSL procedure, this estimate entails computing the unique weighting factor described previously and then using a generalized cross-correlation technique employing the computed weighting factor to estimate the delay time. However, conventional methods of computing the time delay could be employed instead if desired.

The location of the speaker being tracked is estimated next in process action 1206 using the previously estimated delay time. In one version of the SSL procedure, this involves computing a direction angle representing the angle between a line extending perpendicular to a baseline connecting the known locations of the sensors of the selected audio sensor pair from a point on the baseline between the sensors that is assumed for the calculations to correspond to the location of the active camera of the video conferencing system, and a line extending from the assumed camera location to the location of the speaker. This direction angle is deemed to be equal to the arcsine of time delay estimate multiplied by the speed of sound in the space (i.e., 342 m/s), and divided by the length of the baseline between the audio sensors of the selected pair.

It is then determined if there are any remaining previously unselected pairs of synchronized audio sensors (process action 1208). If there are, then process actions 1202 through 1208 are repeated for each remaining pair. If, however, all the pairs have been selected, then the SSL procedure moves on to process action 1210 where it is determined which of the direction angles computed for all the synchronized pairs of audio sensors and their aforementioned mirror angles, correspond to approximately the same direction from the assumed camera location. A final direction angle is then derived based on a weighted combination of the angles determined to correspond to approximately the same direction (process action 1212). As discussed previously, the angles are assigned a weight based on how close the resulting line between the assumed camera location and the estimated location of the speaker would be to the line extending perpendicular to the baseline of the associated audio sensor pair, with the weight being greater the closer the camera-to-speaker location is to the perpendicular line. It is noted that action 1210 can be skipped if the combination procedure handles all the angles such as is the case with the above-described Gaussian approach.

4.0 Post Filtering

While the noise reduction, speech and non-speech classification, and unique SSL procedure described above combine to produce a good estimate of the location of a speaker, it is still based on a single, substantially contemporaneous sampling of the microphone array signals. Many factors can affect the accuracy of the computation, such as other people talking at the exact same time as the speaker being tracked and excessive momentary noise, among others. However, these degrading factors are temporary in nature and will balance out over time. Thus, the estimate of the direction angle can be improved by computing it for a series of the aforementioned sets of signal blocks captured during the same period of time and then combining the individual estimates to produce a refined estimate. As mentioned previously, in tested versions of the speaker location system and process, 1024 samples were collected for approximately 23 ms (i.e., at a 44.1 khz sampling rate) from each audio sensor of the microphone array to produce a set of signal blocks (i.e., one block from each sensor signal). A direction angle was estimated from the signal blocks for each sampling period (i.e., each 23 ms period) using the procedures described previously, if there were speech components contained in the blocks. Then, the computed direction angles were combined to produce a refined final value. Any standard temporal filtering procedure (e.g., median filtering, kalman filtering, particle filtering, and so on) can be used to combine the direction angle estimates computed for each sampling period and produce the desired refined estimate.

While the invention has been described in detail by specific reference to preferred embodiments thereof, it is understood that variations and modifications thereof may be made without departing from the true spirit and scope of the invention. For example, while the foregoing procedures are tailored to track the location of a speaker in the aforementioned 360 degree video conferencing setup, they can be successfully implemented in a more limited conferencing setup, such as where the camera(s) and microphone array are located at one end of the room or hall and face back toward the participants. In addition, while there are cost advantages to employing a plurality of stereo pair sound cards, it is still possible to use a more expensive sound card having more than two synchronized audio sensor inputs. In such a case, each pair of sensors chosen to be a synchronized pair as described previously would be treated in the same way. The fact that the other pairs of sensors would be synchronized with the first and each other is simply ignored for the purposes of the SSL procedure described above.

5.0 REFERENCES

[Bra96] Michael Brandstein, A practical methodology for speech localization with microphone arrays.

[Bra99] Michael Brandstein, Time-delay estimation of reverberated speech exploiting harmonic structure, J. Acoust. Soc. Am. 105(5), May 1999

[Hua00] Yiteng Huang, Jacob Benesty, and Gary Elko, Passive acoustic source localization for video camera steering, ICASSP'00

[Kle00] James Kleban, Combined acoustic and visual processing for video conferencing systems, MS Thesis, The State University of New Jersey, Rutgers, 2000

[Wan97] Wang, H. & Chu, P., Voice source localization for automatic camera pointing system in video conferencing, ICASSP'97

[Zot99] Dmitry Zotkin, Ramani Duraiswami, Ismail Haritaoglu, Larry Davis, A real time acoustic source localization system, TR March 1999

[Zot00] Dmitry Zotkin, Ramani Duraiswami, Ismail Haritaoglu, Larry Davis, An audio-video front-end for multimedia applications Wherefore, what is claimed is:

1. A computer-readable medium having computer-executable instructions for estimating the location of a person speaking using signals output by a microphone array having a plurality of synchronized audio sensor pairs, said computer-executable instructions comprising:

simultaneously sampling the signals to produce a sequence of consecutive blocks of the signal data from each signal, wherein each block of signal data is captured over a prescribed period of time and is at least substantially contemporaneous with blocks of the other signals sampled at the same time;

for each group of contemporaneous blocks of signal data, determining whether a block contains human speech data for each block of signal data, filtering out noise attributable to stationary sources in each of the blocks determined to contain human speech data, estimating the location of the person speaking using a time-delay-of-arrival (TDOA) based sound source localization (SSL) technique on those contemporaneous blocks of signal data determined to contain human speech data for each pair of synchronized audio sensors, and computing a consensus estimated location for the person speaking from the individual location estimates determined from the contemporaneous blocks of filtered signal data found to contain human speech data of each pair of synchronized audio sensors;

computing a final consensus location of the person speaking using a temporal filtering technique to combine the individual consensus locations computed over a prescribed number of sampling periods; and designating the final consensus location as the location of the person speaking.

2. A system for estimating the location of a person speaking, comprising:

a microphone array having two or more audio sensor pairs;

a general purpose computing device;

a computer program comprising program modules executable by the computing device, wherein the computing device is directed by the program modules of the computer program to, input signals generated by each audio sensor of the microphone array;

simultaneously sample the inputted signals to produce a sequence of consecutive blocks of the signal data from each signal, wherein each block of signal data is captured over a prescribed period of time and is at least substantially contemporaneous with blocks of the other signals sampled at the same time;

for each block of signal data, determine whether the block contains human speech data;

filter out noise attributable to stationary sources in each of the blocks of the signal data determined to contain human speech data;

estimate the location of the person speaking using a time-delay-of-arrival (TDOA) based sound source localization (SSL) technique on the contemporaneous blocks of filtered signal data determined to contain human speech data for each pair of audio sensors; and compute a consensus estimated location for the person speaking from the individual location estimates determined from the contemporaneous blocks of filtered signal data found to contain human speech data of each pair of audio sensors.

3. The system of claim 2, further comprising a program module for refining the identified location of the person speaking, said refining module comprising sub-modules for:

computing said consensus location whenever the sensor signal data captured in a prescribed sampling period contains human speech data, for a prescribed number of consecutive sampling periods; and combining the individual computed consensus locations to produce a refined estimate using a temporal filtering technique.

4. The system of claim 3, wherein the temporal filtering technique is one of (i) a median filtering technique, (ii) a kalman filtering technique, and (iii) a particte filtering technique.

5. The system of claim 2, wherein the computing device comprises a separate stereo-pair sound card for each of said pairs of audio sensors, and wherein for each sound card, the output of each sensor in the associated pair of sensor is input to the sound card and the outputs of the sensor pair are synchronized by the sound card.

* * * * *